(12) United States Patent
Huntgeburth et al.

(10) Patent No.: US 11,289,992 B2
(45) Date of Patent: Mar. 29, 2022

(54) ONLINE UPS SYSTEM WITH COMBINED AIR AND WATER COOLING

(71) Applicant: Piller Group GmbH, Osterode am Harz (DE)

(72) Inventors: Joachim Huntgeburth, Duderstadt (DE); Thomas Benke, Nordhausen (DE); Norbert Ueffing, Osterode am Harz (DE)

(73) Assignee: PILLER GROUP GMBH, Osterode am Harz (DE)

( * ) Notice: Subject to any disclaimer, the term of this patent is extended or adjusted under 35 U.S.C. 154(b) by 340 days.

(21) Appl. No.: 16/550,443

(22) Filed: Aug. 26, 2019

(65) Prior Publication Data

US 2019/0379269 A1 Dec. 12, 2019

Related U.S. Application Data

(63) Continuation of application No. PCT/EP2018/054199, filed on Feb. 21, 2018.

(30) Foreign Application Priority Data

Feb. 28, 2017 (EP) .................................... 17158432

(51) Int. Cl.
*H02K 47/04* (2006.01)
*H02K 7/02* (2006.01)
*H05K 7/20* (2006.01)

(52) U.S. Cl.
CPC ............. *H02K 47/04* (2013.01); *H02K 7/025* (2013.01); *H05K 7/20145* (2013.01); *H05K 7/20181* (2013.01)

(58) Field of Classification Search
CPC .......... H05K 7/20181; H05K 7/20145; H05K 7/2018; H05K 7/2089; H05K 7/20; H02K 7/025; H02K 47/04; H02K 7/02
See application file for complete search history.

(56) References Cited

U.S. PATENT DOCUMENTS 7,457,112 B2 * 11/2008 Fukuda ................. G11B 33/022
361/679.48
8,254,124 B2 * 8/2012 Keisling ................. F28D 15/00
361/699
(Continued)

FOREIGN PATENT DOCUMENTS

DE 19852125 C1 4/2000
EP 1001671 B1 10/1999
(Continued)

OTHER PUBLICATIONS

International Preliminary Report and Written Opinion in co-pending, related application No. PCT/EP2018/054199, dated Sep. 3, 2019.

*Primary Examiner* — Tran N Nguyen
*Assistant Examiner* — Leda T Pham
(74) *Attorney, Agent, or Firm* — Thomas | Horstemeyer, LLP

(57) ABSTRACT

In an UPS system, following components are arranged in a machine cabinet: an AC-to-DC converter connected to a DC voltage link on its output side, a DC-to-AC converter connected to the DC voltage link on its input side; a motor/generator electrically connected to the DC voltage link and having a flywheel coupled to its rotor; a bypass to the AC-to-DC converter and the DC-to-AC converter connected in series, a bypass switch being arranged in the bypass; a controller; and a blower which draws air out of the surroundings through air filters, blows the air in the machine cabinet through a heat exchanger, and ejects the air again. The heat exchanger is arranged in a coolant circuit together with a coolant pump, cooling bodies for the power output stages, and coolant channels which include stator channels running through a stator of the motor/generator.

20 Claims, 3 Drawing Sheets

(56) References Cited

U.S. PATENT DOCUMENTS

2010/0085708 A1\* 4/2010 Martin ............... H05K 7/20927
            361/696
2019/0379269 A1\* 12/2019 Huntgeburth ...... H05K 7/20181

FOREIGN PATENT DOCUMENTS

| EP | 1226643 | B1 | 2/2004 |
| EP | 1961281 | A2 | 6/2007 |
| WO | 2007/065666 | A2 | 6/2007 |

\* cited by examiner

ONLINE UPS SYSTEM WITH COMBINED AIR AND WATER COOLING

CROSS REFERENCE TO RELATED APPLICATIONS

This application is a continuation to International Application PCT/EP2018/054199 with an international filing date of Feb. 21, 2018 entitled "Online UPS System with combined Air and Water Cooling" and claiming priority to European Patent Application No. EP 17 1584 432.9 entitled "Online-USV-Anlage mit kombinierter Luft-und Wasserkühlung" and filed Feb. 28, 2017.

FIELD OF THE INVENTION

The invention relates to an UPS-system. More particularly the invention relates to an UPS-system comprising components arranged in a machine cabinet, and a blower blowing air through the machine cabinet for cooling the components.

Particularly, the UPS-system is a compact UPS-system arranged in a machine cabinet and having a high power density as compared to its dimensions. With such a high power density, the heat balance of the UPS-system has particularly to be attended to.

BACKGROUND OF THE INVENTION

In a known UPS-system, the following components are arranged in a machine cabinet: (i) an AC-to-DC converter having a power output stage and connected to a DC voltage link on its output side, (ii) a DC-to-AC converter having a further power output stage and connected to the DC voltage link on its input side, (iii) a bidirectional DC-to-AC converter having an even further power output stage and connected to the DC voltage link, (iv) a motor/generator connected to the AC side of the bidirectional DC-to-AC converter, a flywheel mechanically coupled to a rotor of the motor/generator, (v) a bypass to the AC-to-DC converter and the DC-to-AC converter connected in series, in which a bypass switch is arranged, (vi) a controller for the AC-to-DC converter, the DC-to-AC converter, the motor/generator and the bypass switch, as well as (vii) a blower which draws air out of the surroundings of the machine cabinet through an air filter into the machine cabinet, blows the air within the machine cabinet through a heat exchanger, and ejects the air out of the machine cabinet again.

Due to the AC-to-DC converter and the DC-to-AC converter connected in series, this UPS-system is a so-called Online-UPS that can supply loads connected to the output of the DC-to-AC converter via this series connection out of a main AC source. With the aid of the AC-to-DC converter and the DC-to-AC converter connected in series, the quality of the AC current provided to the loads can be enhanced as compared to the main AC source. If, however, the output quality of the AC current is sufficient, the load can be supplied directly out of the main AC source, bypassing the AC-to-DC converter and the DC-to-AC converter via the bypass. In case of a partial or complete failure of the main AC source, the load can be supplied via the motor/generator, the bidirectional DC-to-AC converter and the DC-to-AC converter out of the flywheel. For this purpose, the flywheel has to be put in rotation up front via the AC-to-DC converter, the bidirectional DC-to-AC converter and the motor/generator to store kinetic energy therein.

An UPS-system comprising a housing, a flywheel energy storage unit that provides short term backup energy to a load and is arranged within the housing, and a UPS electronic unit that provides continuous power to the load from one of the following power sources: a flywheel unit, a utility power supply and a long term source of backup power which is also arranged in the housing, is known from European patent EP 1 226 643 B1. A cooling system for cooling the flywheel unit and the UPS electronic unit has a forced air convection cooling system which draws cooling air across the flywheel unit and the UPS electronic unit. Particularly, the convection cooling system leads the cooling air at first across the flywheel unit and then across the UPS electronic unit. Further, the convection cooling system comprises a plurality of blowers and each blower has a dampening element that runs air drawn by the blower outside of that housing again. The damping elements each have a flap which is opened and closed depending on a pressure difference between the interior pressure and the outside pressure of the housing. The housing has a stable base at which the flywheel unit is supported, and a frame mounted to the base that holds a control electronic for the flywheel unit and the UPS electronic unit. The base and the frame of the housing are together cladded by side panels and access door panels and a lid in which the flaps are provided.

An apparatus for uninterrupted power supply which is to be connected between an AC source whose interruptions are to be bridged, and one or more loads to be supplied with AC current is known from German patent DE 198 52 125 C1. The apparatus includes at least one rectifier for the input AC current, accumulators for intermediately storing electric energy, at least one DC-to-AC converter for the battery voltage of the accumulators, and a control electronic. A power current flows through electric coil forms, particularly inductors and chokes, and solid-state electronic components of the apparatus. The coil forms are arranged in a first basin filled with a first cooling liquid. A line system for a second cooling liquid has heat exchange surfaces facing the first cooling liquid and the solid-state electronic components. A pressure compensation means provided for the first cooling liquid has a compressible gas volume. A heat exchanger is provided for the second cooling liquid to withdraw heat therefrom. In the known apparatus for uninterrupted power supply, no cooling air from the outside is leaded through the apparatus to avoid the buildup of contaminations. It has a closed housing for all electronic and electric components, out of which and into which only the current lines and the lines for the second cooling liquid exit and enter, respectively. The heat exchanger is arranged outside this housing.

An UPS-system with direct cooling of different ones of its heat producing components is known from US patent application publication US 2010/0085708 A1. The heat producing components of this UPS-system are arranged in a switch cabinet and include an AC-to-DC converter, a DC-to-AC converter, a switch and at least one transformer. The AC-to-DC converter, the DC-to-AC converter and the switch are cooled by cooling plates through which a cooling liquid flows. The cooling liquid is circulated by a pump in a cooling liquid circuit in which a heat exchanger is arranged. In a heat exchanger, the excess air is transferred from the cooling liquid to air by which the transformer is air-cooled. The known UPS-system uses a battery as an energy storage. As another option of a backup power supply, that one out of a flywheel is mentioned.

An UPS-system comprising a cooling device made of an air cooler to which a liquid cooler is mounted is known from international application publication WO 2007/065666 A2.

Here, the air cooler is arranged between the liquid cooler and heat producing electric components, particularly power semiconductors, as a heat bridge between the heat producing components and the liquid cooler. The liquid cooler serves for increasing the cooling performance of the cooling device as compared to its formation of the air cooler only.

There still is a need of a UPS-system having an enhanced cooling system such that its power density can be increased without problems occurring with regard to its heat balance.

SUMMARY OF THE INVENTION

The present invention relates to a UPS-system comprising the following components arranged within a machine cabinet: (i) an AC-to-DC converter having a first power output stage and a output side, and being connected to a DC voltage link on the output side, (ii) a DC-to-AC converter having a second power output stage and a input side, and being connected to the DC voltage link on the input side, (iii) a bidirectional DC-to-AC converter having a third power output stage, a DC side and a AC side, and being connected to the DC voltage link on the DC side, (iv) a motor/generator having a stator, a rotor and a flywheel mechanically coupled to the rotor, the motor/generator being electrically connected to the bidirectional DC-to-AC converter at the AC side, (v) a bypass bypassing the AC-to-DC converter and the DC-to-AC converter connected in series, a bypass switch being arranged in the bypass, (vi) a controller configured to control the AC-to-DC converter, the DC-to-AC converter, the motor/generator and the bypass switch, (vii) a blower configured to draw air out of surroundings of the machine cabinet through air filters into the machine cabinet, to blow the air within the machine cabinet through a heat exchanger, and to eject the air out of the machine cabinet again, and (vii) a closed coolant circuit, in which the heat exchanger is arranged together with a coolant pump, coolant channels through the motor/generator and cooling to bodies for the power output stages, the coolant channels including stator channels that run through the stator of the motor/generator.

Other features and advantages of the present invention will become apparent to one with skill in the art upon examination of the following drawings and the detailed description. It is intended that all such additional features and advantages be included herein within the scope of the present invention, as defined by the claims.

BRIEF DESCRIPTION OF THE DRAWINGS

The invention can be better understood with reference to the following drawings. The components in the drawings are not necessarily to scale, emphasis instead being placed upon clearly illustrating the principles of the present invention. In the drawings, like reference numerals designate corresponding parts throughout the several views.

DETAILED DESCRIPTION

Figure 1:
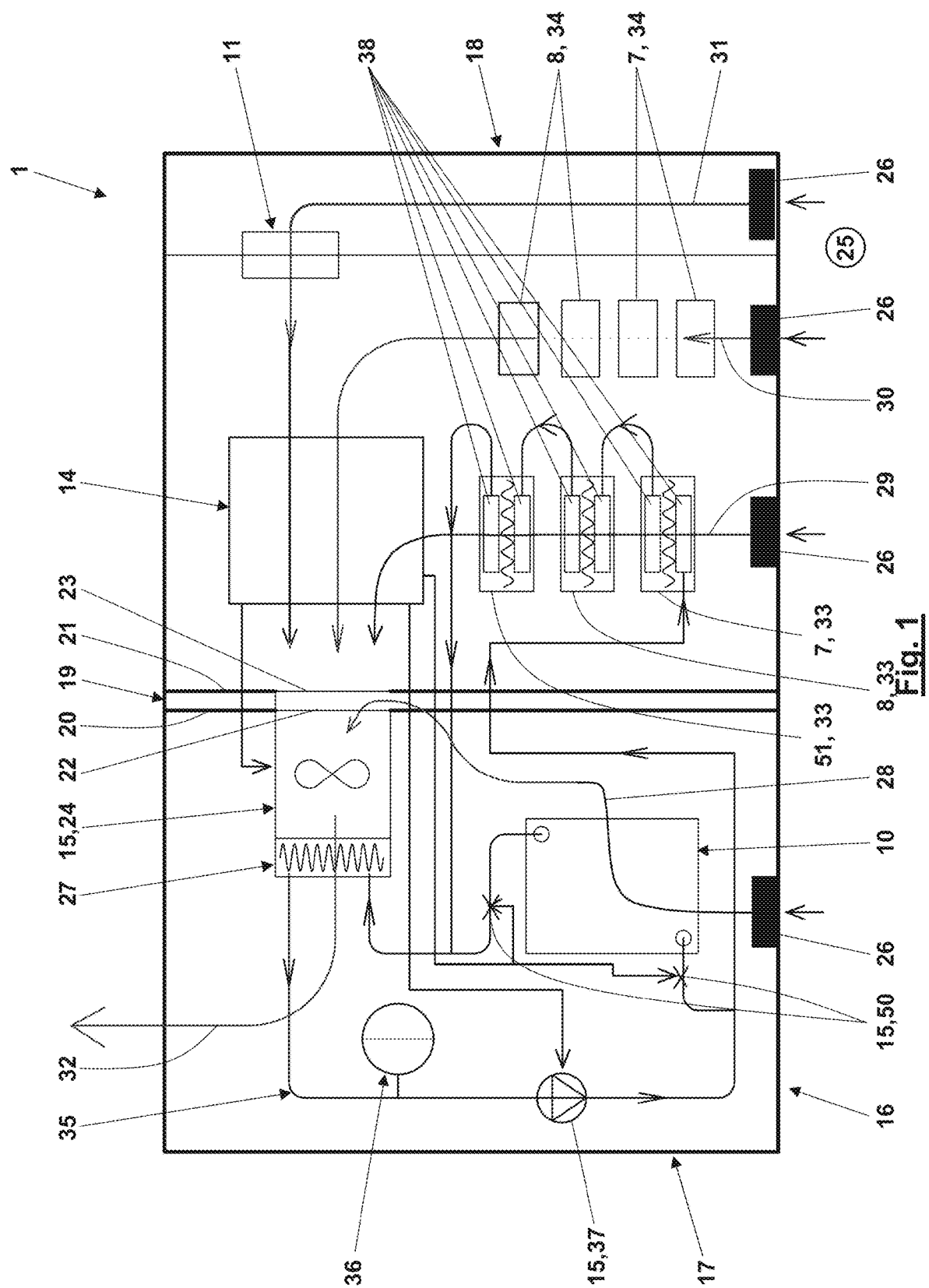
FIG. 1 is a schematic depiction of a cooling system of an UPS-system according to the invention.

In an UPS-system according to the present disclosure, the following components are arranged in a machine cabinet: (i) an AC-to-DC converter having a power output stage and connected to a DC voltage link on its output side, (ii) a DC-to-AC converter having a further power output stage and connected to the DC voltage link on its input side, (iii) a bidirectional DC-to-AC converter having an even further power output stage and connected to the DC voltage link, (iv) a motor/generator connected to the AC side of the bidirectional DC-to-AC converter, a flywheel mechanically coupled to a rotor of the motor/generator, (v) a bypass to the AC-to-DC converter and the DC-to-AC converter connected in series, in which a bypass switch is arranged, (vi) a controller for the AC-to-DC converter, the DC-to-AC converter, the motor/generator and the bypass switch, as well as (vii) a blower which draws air out of the surroundings of the machine cabinet through an air filter into the machine cabinet, blows the air within the machine cabinet through a heat exchanger, and ejects the air out of the machine cabinet again. According to the present disclosure, the heat exchanger, together with a coolant pump, coolant channels through the motor/generator and cooling bodies for the power output stages, is arranged in (viii) a closed coolant circuit, wherein the coolant channels through the motor/generator include stator channels that run through the stator of the motor/generator.

The UPS-system according to the present disclosure has a hybrid cooling system which uses the heat capacitance of air out of the surroundings both for a basic cooling of the components arranged in the machine cabinet and an enhanced heat removal from critical components by means of a coolant. The coolant is cooled in the heat exchanger through which the air drawn into the machine cabinet is blown within the machine cabinet, before it is ejected out of the machine cabinet again. The coolant is circulated by the coolant pump through a coolant circuit in which, besides the coolant pump, coolant channels through the motor/generator and cooling bodies for the power output stages are arranged. Thus, at least the motor/generator and the power output stages of the converters are cooled by means of the coolant. This, however, does not exclude that a coolant cooling is also provided for even further components of the UPS-system within the machine cabinet. However, for example, the controller of the UPS-system is as a rule sufficiently cooled with air, as the electric powers flowing therethrough are only small. Further, it has to be considered that no higher voltages are present in the controller, which in case of contaminations within the machine cabinet would be connected with a relevant danger of spark overs. There, where higher voltages are present in the UPS-system according to the present disclosure, like for example in the power output stages of the converters, the coolant cooling is employed. Further, a contamination of the interior of the machine cabinet is obviated by means of the air filters, through which the air is drawn into the machine cabinet.

In the UPS-system according to the present disclosure, the integration of the motor/generator into the coolant circuit is unusual. This, however, allows for a very considerable increase in the power density of the UPS-system with regard to the kinetic energy, which is stored in the flywheel mechanically coupled to the rotor of the motor/generator. The coolant, which flows through the stator channels through the stator of the motor/generator, does not only cool the stator as such but also the bearings for the rotor of the motor/generator.

The coolant channels through the motor/generator may further include housing channels which run through a housing of the motor/generator. If both the stator and the housing of the motor/generator are cooled by coolant, an indirect cooling of the rotor of the motor/generator rotating in between is also achieved. This particularly applies, if the housing of the motor/generator does not only enclose the rotor but also the flywheel mechanically coupled thereto.

In the UPS-system according to the present disclosure, the motor/generator may be constructed rather compact, wherein the flywheel encloses the rotor of the motor/generator. In other words, in the UPS-system according to the present disclosure, the physical mass of the rotor of the motor/generator is increased to such an extent that it is effective as a flywheel mechanically coupled to the rotor, in the rotation of which a considerable kinetic energy for the backup supply of a load by the UPS-system can be stored. In this embodiment of the UPS-system according to the present disclosure, the flywheel which is coupled to the rotor of the motor/generator may, without further measures, not be decoupled or otherwise separated from the rotor but forms a closed constructional unit together with the rotor.

In the motor/generator of the UPS-system according to the present disclosure, the stator channels and the housing channels may be connected in parallel. For a forced flow through the coolant channels, the stator channels and the housing channels may be connected in series. In this case, the stator channels can be arranged downstream of the housing channels.

Generally, the cooling bodies for the power output stages and the coolant channels may also be connected in series, wherein the cooling bodies may be arranged downstream of the coolant channels. Alternatively, the cooling bodies and the coolant channels can be connected in parallel to be able to differently adjust the coolant cooling of the motor/generator and of the power output stages according to the present needs by means of valves in the coolant circuit.

In the UPS-system according to the present disclosure, a coolant cooling for filter inductors, which are, as a rule, part of the output side DC-to-AC converter but also of the input side AC-to-DC converter and, thus, also arranged in the machine cabinet, may also be integrated into the coolant circuit. Here, it may be advantageous to arrange the coolant cooling downstream of the cooling bodies for the power output stages, because the filter inductors will cope with a certain increase in temperature without problem.

Further, a compensation reservoir for the coolant may be arranged in the coolant circuit. This compensation reservoir may optionally enclose a compressible gas volume. In principal, the coolant may be gaseous or vaporous. Often, however, it is a cooling liquid.

With regard to the cooling with air, the blower, the air filter and further air guiding devices of the UPS-system according to the present disclosure may be arranged such that they lead a plurality of partial flows of the air through the machine cabinet in parallel to each other, which are only merged upon entrance of the air into the blower. One of the partial flows of the air through the machine cabinet may be leaded around the motor/generator and may cool the motor/generator in addition to the cooling with the coolant. A further partial flow may be leaded around the filter inductors of the DC-to-AC converter and/or the AC-to-DC converter to cool them alone or in combination with an additional coolant cooling. An even further partial flow of the air may be leaded around the bypass switch of the bypass to cool it. The controller of the UPS-system may be cooled by an even further partial flow of the air. Often, however, a convection cooling will be sufficient here so that it can be done without a forced circulation of the air in the area of the controller.

The heat exchanger in the coolant circuit may particularly be arranged upstream of the blower and thus in the merged partial flows of the air through the machine cabinet. In the heat exchanger, direct heat exchange between the air and the coolant may occur. Thus, the UPS-system according to the present disclosure, as a rule, does without the use of a second coolant, which could, for example, be evaporated and condensed again in a circle process to reduce the temperature of the coolant leaded through the coolant circuit below the temperature of the air which is blown through the heat exchanger.

The machine cabinet of the UPS-system according to the present disclosure may include two partial cabinets arranged side by side, which form separate transport units of the UPS-system. Here, a partition wall of the machine cabinet may be formed by two overlapping walls of the partial cabinets, which separate the partial cabinets from one another but which are provided with aligned air passage openings. For the transport of the partial cabinets, these air passage openings may be closed.

Particularly, one of the two partial cabinet may enclose the motor/generator, the blower, the exchanger and the coolant pump, i.e. all components of the UPS-system with movable parts, whereas the other partial cabinets includes the power output stages, the filter inductors of the DC-to-AC converter and/or the AC-to-DC converter, the bypass switch and the controller, i.e. all purely electric or electronic components of the UPS-system.

Figure 2:
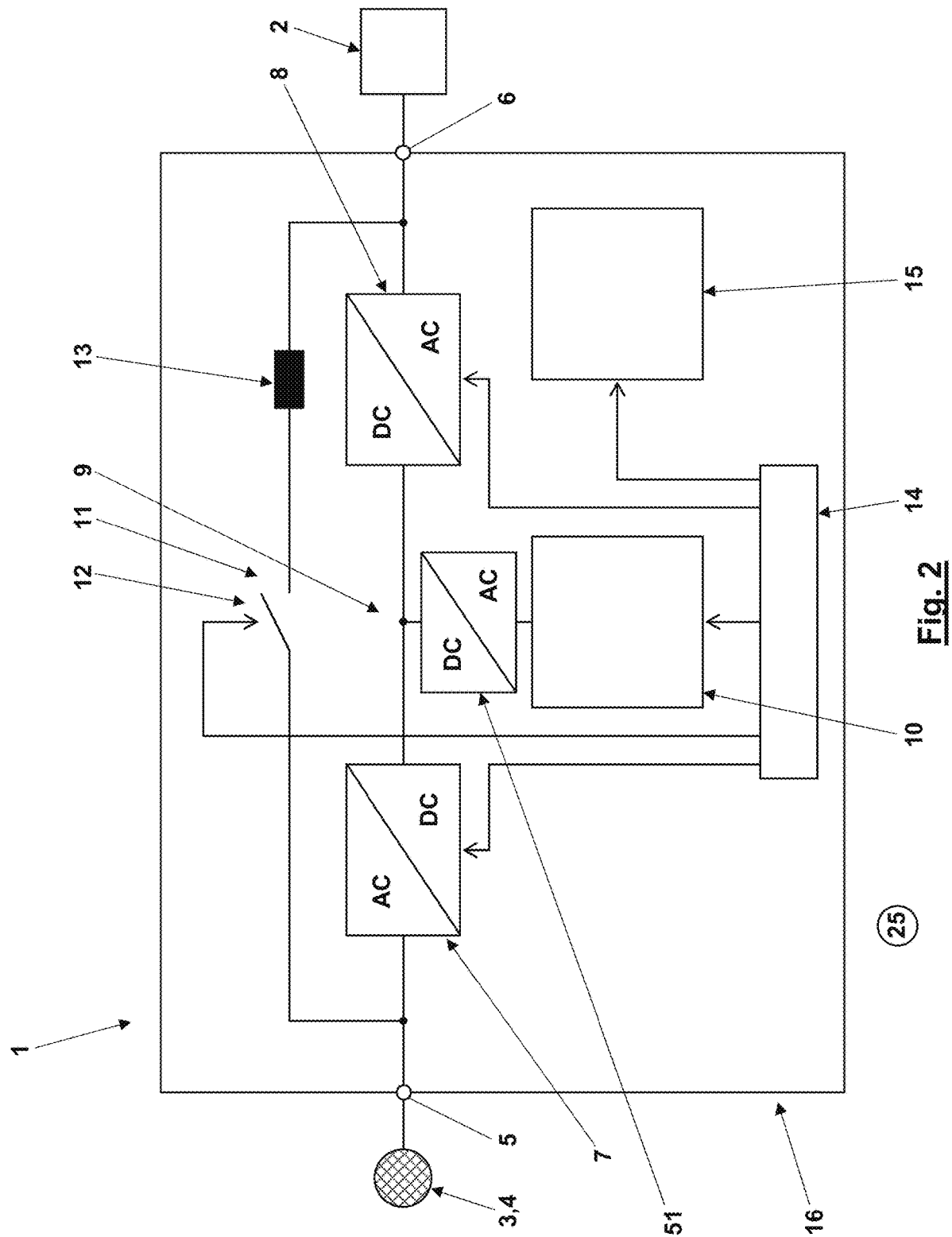
FIG. 2 is a schematic depiction of the electric and electronic design of the UPS system according to the invention according to FIG. 1.

Now referring in greater detail to the drawings, the UPS-system 1 depicted in FIGS. 1 and 2 with regard to different aspects, serves for an uninterrupted supply of a load 2 with electric power. The UPS-system 1 is connected between the load 2 and a main AC source 3, for example a public AC grid 4, see FIG. 2. Between an input 5 and an output 6, the UPS-system 1 comprises an AC-to-DC converter 7 and a DC-to-AC converter 8 connected in series, wherein to a DC voltage link 9 connected in between a motor/generator 10 is additionally connected via a bidirectional DC-to-AC converter 51. A flywheel, which is rotated in operation of the motor/generator 10, is mechanically coupled to the rotor of the motor/generator 1. If the main AC source fails, the electric energy stored in the rotating flywheel can be used for supplying the load 2 with electric power via the motor/generator 10 operated as a generator and the DC-to-AC converter 8. By means of the AC-to-DC converter 7 and the DC-to-AC converter 8 connected in series and using the motor/generator 10, the quality of the current out of the main AC source 3 may be enhanced, and the supply of the load 2 with electric power may be stabilized, even if the main AC source 3 does not fail. Further, the UPS-system 1 includes a bypass 11 with a bypass switch 12, which is provided in parallel to the AC-to-DC converter 7 and the DC-to-AC converter 8 connected in series and which serves for bridging this series connection, when the load 2 can be supplied directly out of the main AC source 3. A basic supply of the load 2 out of the main AC voltage 3 while stabilizing the voltage present at the output 6 by means of the DC-to-AC converter 8 is enabled by an additional inductor 13 in the bypass 11. A controller 14 of the UPS-system 1 is provided for the AC-to-DC converter 7, the DC-to-AC converter 8, the bypass switch 12 and the motor/generator 10. The controller 14 also controls a cooling system 15 of the UPS-system 1. All components 7 to 15 of the UPS-system 1 are arranged in a machine cabinet 16.

FIG. 1 shows that this machine cabinet 16 has two partial cabinets 17 and 18 arranged side by side, wherein a partition wall 19 of the machine cabinet 16 is formed by two overlapping walls 20 and 21 of the partial cabinets 17 and 18, in which aligned air passage openings 22 and 23 are provided. All components of the UPS-system 1 with moveable parts are arranged in the partial cabinet 17, whereas the partial cabinet 18 houses the purely electric and electronic components. A blower 24 of the cooling system 15 in the partial cabinet 17 draws air out of the surroundings 25 through air filters 26 in the bottom area of both partial cabinets 17 and 18 into the machine cabinets 16. The blower 24 blows the air through a heat exchanger 27 and then ejects it out of the machine cabinet 16 again. Here, the air filter 26, the blower 24 and further not depicted air guiding devices are designed and arranged in such a way that a plurality of partial flows 28 to 31 of the air runs through the machine cabinet until all partial flows 28 to 31 are merged upon entry of the air into the blower 24, and a merged main flow 32 runs through the heat exchanger 27 and out of the machine cabinet 16. The one partial flow 28 runs across the motor/generator 10. The partial flow 29 runs across power output stages 33 of the AC-to-DC converter 7, the DC-to-AC converter 8 and the bidirectional DC-to-AC converter 51. The partial flow 30 runs across filter inductors 34 of the AC-to-DC converter 7 and the DC-to-AC converter 8; and the partial flow 31 runs across the bypass 11. These partial flows or a further one of the partial flows of the air through the machine cabinet 16 may flow across the controller 14, or the controller 14 may be arranged out of these partial flows and be cooled by convection only. An additional coolant circuit 35 is provided for the motor/generator 10 and the power output stages 33 of the DC-to-AC converter 8, in which the heat exchanger 27, a compensation reservoir 36, a coolant pump 37, coolant channels through the motor/generator 10 and cooling bodies 38 for the power output stages 23 are arranged. Here, the coolant channels through the motor/generator 10 and the cooling bodies 38 are connected in parallel. By means of the coolant circuit 35, those components of the UPS-system 1, which, with a high power density of the UPS-system 1, have the highest tendency to overheat, are selectively additionally cooled with coolant. For controlling the cooling system 15, the controller 14, besides the blower 24, may operate the coolant pump 37 and valves 50 which adjust the relative flow through the coolant channels through the motor/generator 10 with regard to the flow through the cooling bodies 38. However, there is no need that the valves are operated by the controller 14, instead they may only be adjusted once to set the relative flows through the coolant channels through the motor/generator 10 and the cooling components 38.

Figure 3:
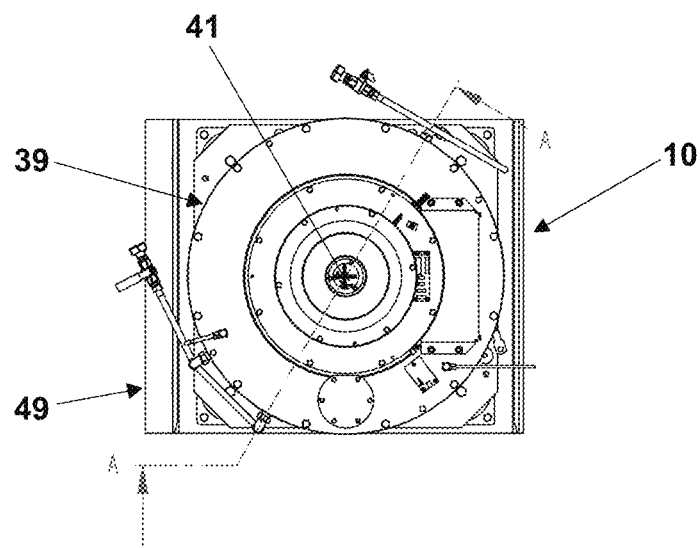
FIG. 3 shows a motor/generator of the UPS-system according to the invention according to FIG. 1 in a top view.
Figure 4:
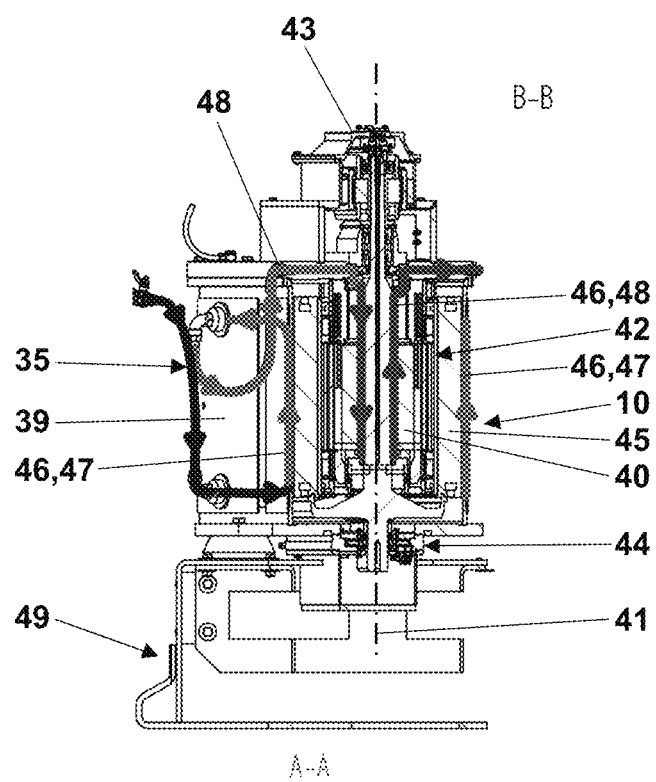
FIG. 4 shows the motor/generator according to FIG. 3 in a sectional view according to a section line A-A drawn in FIG. 3.

FIG. 3 shows the motor/generator 10 of the UPS-system in a top view, and FIG. 4 in a sectional view along a vertical section line A-A according to FIG. 3. The motor/generator 10 comprises a housing 39 in the middle of which a stator 40 is arranged. Around the stator 40, a rotor 42 is mounted in rotation bearings 43 and 44 rotating about a vertical rotation axis 41. The rotor 42 is mechanically coupled to a flywheel 45, which rotates with the rotor 42 about the rotation axis 41. In operation of the motor/generator 10 as a motor, the flywheel 45 is rotated about the rotation axis 41 to store kinetic energy in the flywheel 45. This kinetic energy may be re-transformed into electric energy, when the motor/generator 10 is operated as a generator. The coolant channels 46 of the coolant circuit 35 through the motor/generator 10 include housing channels 47 through the housing 39 and for cooling the housing 39, and stator channels 48 through the stator 40. Further, FIG. 4 shows a lower vertical support 49 via which the motor/generator 10 is mounted in the partial cabinet 17 of the machine cabinet 16.

Many variations and modifications may be made to the preferred embodiments of the invention without departing substantially from the spirit and principles of the invention. All such modifications and variations are intended to be included herein within the scope of the present invention, as defined by the following claims.

We claim:

1. A UPS-system comprising components as follows arranged within a machine cabinet:
    an AC-to-DC converter having a first power output stage and a output side, and being connected to a DC voltage link on the output side,
    a DC-to-AC converter having a second power output stage and a input side, and being connected to the DC voltage link on the input side,
    a bidirectional DC-to-AC converter having a third power output stage, a DC side and a AC side, and being connected to the DC voltage link on the DC side, a motor/generator having a stator, a rotor and a flywheel mechanically coupled to the rotor, the motor/generator being electrically connected to the bidirectional DC-to-AC converter at the AC side,
    a bypass bypassing the AC-to-DC converter and the DC-to-AC converter connected in series, a bypass switch being arranged in the bypass, a controller configured to control the AC-to-DC converter, the DC-to-AC converter, the motor/generator and the bypass switch,
    a blower configured to draw air out of surroundings of the machine cabinet through air filters into the machine cabinet, to blow the air within the machine cabinet through a heat exchanger, and to eject the air out of the machine cabinet again, and
    a closed coolant circuit, in which the heat exchanger is arranged together with a coolant pump, coolant channels through the motor/generator and cooling bodies for the power output stages, the coolant channels including stator channels that run through the stator of the motor/generator.

2. The UPS-system of claim 1, wherein the coolant channels include housing channels that run through a housing of the motor/generator.

3. The UPS-system of claim 2, wherein the housing encloses the rotor and the flywheel mechanically coupled thereto.

4. The UPS-system of claim 2, wherein the stator channels are connected in parallel to the housing channels.

5. The UPS-system of claim 2, wherein the stator channels and the housing channel are connected in series.

6. The UPS-system of claim 5, wherein the stator channels are arranged downstream of the housing channels.

7. The UPS-system of claim 2, wherein the flywheel encloses the rotor of the rotor/generator.

8. The UPS-system of claim 1, wherein the cooling bodies and the coolant channels are connected in parallel.

9. The UPS-system of claim 1, wherein the cooling coolant channels and the coolant channels are connected in series.

10. The UPS-system of claim 9, wherein, wherein the cooling coolant bodies are arranged downstream of the cooling channels.

11. The UPS-system of claim 1, wherein a coolant cooling for filter inductors of at least one of the AC-to-DC converter and the DC-to-AC converter is arranged in the coolant circuit.

12. The UPS-system of claim 11, wherein the coolant cooling is arranged downstream of the cooling bodies.

13. The UPS-system of claim 1, wherein a compensation reservoir is arranged in the coolant circuit, the compensation reservoir including a compressible gas volume.

14. The UPS-system of claim 1, wherein the blower, the air filters and further air guiding devices are configured to lead a first partial flow of the air through the machine cabinet around the motor/generator.

15. The UPS-system of claim 1, wherein the blower, the air filters and further air guiding devices are configured to lead a second partial flow of the air through the machine cabinet around filter inductors of at least one of the AC-to-DC converter and the DC-to-AC converter.

16. The UPS-system of claim 1, wherein the blower, the air filters and further air guiding devices are configured to lead a third partial flow of the air through the machine cabinet around the bypass switch.

17. The UPS-system of claim 1, wherein the blower and further air guiding devices are configured to merge all flows of the air through the machine cabinet upon entry of the air into the blower.

18. The UPS-system of claim 17, wherein the heat exchanger is arranged downstream of the blower.

19. The UPS-system of claim 1, wherein the machine cabinet comprises two partial cabinet arranged side by side, wherein a partition wall of the machine cabinet is formed by two overlapping walls of the two partial cabinets, the two overlapping walls having aligned air passage openings.

20. The UPS-system of claim 19, wherein one of the two partial cabinets encloses the motor/generator, the blower, the heat exchanger and the coolant pump, whereas the other of the two partial cabinets encloses the power output stages, filter inductors of at least one of the AC-to-DC converter and the DC-to-AC converter, the bypass switch and the controller.

* * * * *